(12) United States Patent
Bonakdar et al.

(10) Patent No.: US 11,862,651 B2
(45) Date of Patent: Jan. 2, 2024

(54) LIGHT-TRAPPING IMAGE SENSORS

(71) Applicant: OmniVision Technologies, Inc., Santa Clara, CA (US)

(72) Inventors: Alireza Bonakdar, San Jose, CA (US); Zhiqiang Lin, San Jose, CA (US); Lindsay Grant, Campbell, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 194 days.

(21) Appl. No.: 16/777,060

(22) Filed: Jan. 30, 2020

(65) Prior Publication Data

US 2021/0242264 A1 Aug. 5, 2021

(51) Int. Cl.
*H01L 27/146* (2006.01)
*G02B 3/00* (2006.01)
*G02B 5/20* (2006.01)

(52) U.S. Cl.
CPC ...... *H01L 27/14629* (2013.01); *G02B 3/0037* (2013.01); *G02B 5/201* (2013.01); *G02B 5/208* (2013.01); *H01L 27/1463* (2013.01); *H01L 27/1464* (2013.01); *H01L 27/14621* (2013.01); *H01L 27/14627* (2013.01); *H01L 27/14636* (2013.01); *H01L 27/14645* (2013.01); *H01L 27/14685* (2013.01)

(58) Field of Classification Search
CPC ......... H01L 27/14629; H01L 27/14621; H01L 27/14627; H01L 27/1463; H01L 27/14636; H01L 27/1464; H01L 27/14645; H01L 27/14685; H01L 27/14623; G02B 3/0037; G02B 5/201; G02B 5/208
See application file for complete search history.

(56) References Cited

U.S. PATENT DOCUMENTS 5,824,236 A * 10/1998 Hawkins ........... H01L 31/02327
257/E31.128
7,973,380 B2 * 7/2011 Hsu ................... H01L 27/14618
250/214.1

(Continued)

FOREIGN PATENT DOCUMENTS

CN 103399368 A 11/2013
CN 203365711 U 12/2013

OTHER PUBLICATIONS

Chang, et al. "Shape-controlled, high fill-factor microlens arrays fabricated by a 3D diffuser lithography and plastic replication method." Optics Express 12.25 (2004): 6366-6371.

(Continued)

*Primary Examiner* — Ermias T Woldegeorgis
(74) *Attorney, Agent, or Firm* — COZEN O'CONNOR

(57) ABSTRACT

A light-trapping image sensor includes a pixel array and a lens array. The pixel array is formed in and on a semiconductor substrate and including photosensitive pixels each including a reflective material forming a cavity around a portion of semiconductor material to at least partly trap light that has entered the cavity. The cavity has a ceiling at a light-receiving surface of the semiconductor substrate, and the ceiling forms an aperture for receiving the light into the cavity. The lens array is disposed on the pixel array. Each lens of the lens array is aligned to the aperture of a respective cavity to focus the light into the cavity through the aperture.

12 Claims, 10 Drawing Sheets

(56) References Cited

U.S. PATENT DOCUMENTS

| | | | |
|---|---|---|---|
| 8,530,266 B1* | 9/2013 | Chen | H01L 27/1464 257/730 |
| 9,030,550 B2* | 5/2015 | Georgiev | H04N 5/225 348/135 |
| 9,780,131 B1 | 10/2017 | Woo et al. | |
| 9,954,020 B1 | 4/2018 | Lu et al. | |
| 2005/0110104 A1* | 5/2005 | Boettiger | H01L 27/14627 257/E31.127 |
| 2008/0142686 A1* | 6/2008 | Konno | H01L 27/14678 257/432 |
| 2013/0050526 A1* | 2/2013 | Keelan | H01L 27/14627 250/206 |
| 2013/0128077 A1* | 5/2013 | Georgiev | H04N 5/22541 348/222.1 |
| 2013/0200251 A1* | 8/2013 | Velichko | H01L 27/14629 257/432 |
| 2016/0035770 A1* | 2/2016 | Ahn | H01L 27/1463 257/432 |
| 2016/0049430 A1 | 2/2016 | Nomura | |
| 2018/0084185 A1 | 3/2018 | Lu et al. | |
| 2019/0096945 A1 | 3/2019 | Lu et al. | |

OTHER PUBLICATIONS

Kim, Y. et al., "High-Sensitivity Pixels with a Quad-WRGB Color Filter and Spatial Deep-Trench Isolation" Sensors 2019, 10 pages.

U.S. Appl. No. 16/777,027 2021-0242259, filed Jan. 30, 2020 Aug. 5, 2021, Alireza Bonakdar.

U.S. Appl. No. 16/777,193 2021-024226, filed Jan. 30, 2020 Aug. 5, 2021, Alireza Bonakdar.

U.S. Appl. No. 16/777,090 2021-0242262, filed Jan. 30, 2020 Aug. 5, 2021, Alireza Bonakdar.

U.S. Appl. No. 16/777,060 2021-0242264, filed Jan. 30, 2020 Aug. 5, 2021, Alireza Bonakdar.

U.S. Appl. No. 16/777,027, Non-Final Office Action dated Jan. 18, 2022, 16 pages.

* cited by examiner

LIGHT-TRAPPING IMAGE SENSORS

BACKGROUND

An image sensor, such as a charge coupled device (CCD) image sensor or a complementary metal oxide semiconductor (CMOS) image sensor, converts incident light to electrical charge. The quantum efficiency of an image sensor is the percentage of the incident photons that produce a charge carrier in the image sensor. For each pixel of an image sensor, the quantum efficiency is defined by a combination of several factors, including the efficiency with which incident light is directed to a photodiode of the pixel (i.e., the external quantum efficiency) and the efficiency with which the photodiode converts a photon to a charge carrier (i.e., the internal quantum efficiency which is directly related to the photodiode material's absorption coefficient). The internal quantum efficiency is determined by the material of the photodiode and the wavelength of the incident light. The most widespread image sensors are CMOS image sensors based on silicon. In the case of silicon, the internal quantum efficiency is above 80% percent throughout the visible spectrum but drops sharply when the wavelength of the light exceeds 1000 nanometers.

An image sensor's quantum efficiency may be a critical parameter to achieve the desired performance when the image sensor is deployed in a low-light situation. One such example is night-vision cameras configured to image a scene in the infrared spectrum. A related example is day-and-night surveillance, where the same camera is used to (a) during the day, image a scene based on visible light and (b) during the night, image the same scene in the dark based on infrared light that, at least for silicon-based image sensors, is less efficiently converted to electrical charge in the image sensor.

SUMMARY

In an embodiment, a light-trapping image sensor includes a pixel array and a lens array. The pixel array is formed in and on a semiconductor substrate and including photosensitive pixels each including a reflective material forming a cavity around a portion of semiconductor material to at least partly trap light that has entered the cavity. The cavity has a ceiling at a light-receiving surface of the semiconductor substrate, and the ceiling forms an aperture for receiving the light into the cavity. The lens array is disposed on the pixel array. Each lens of the lens array is aligned to the aperture of a respective cavity to focus the light into the cavity through the aperture.

DESCRIPTION OF EXAMPLE EMBODIMENTS

Figure 1:
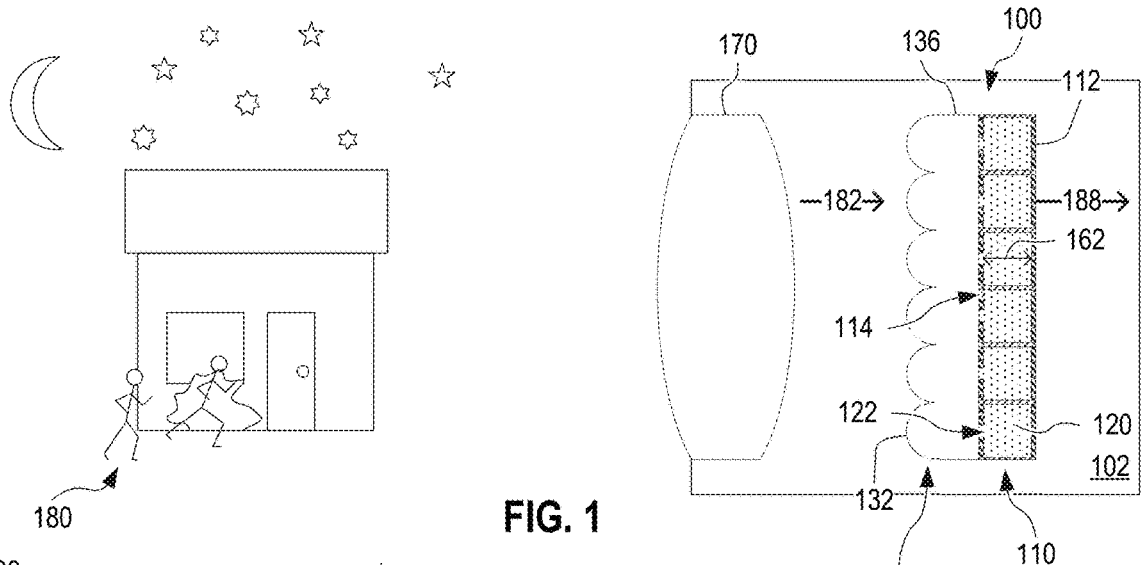
FIGS. 1, 2, and 3 illustrate a light-trapping image sensor, according to an embodiment.
Figure 2:
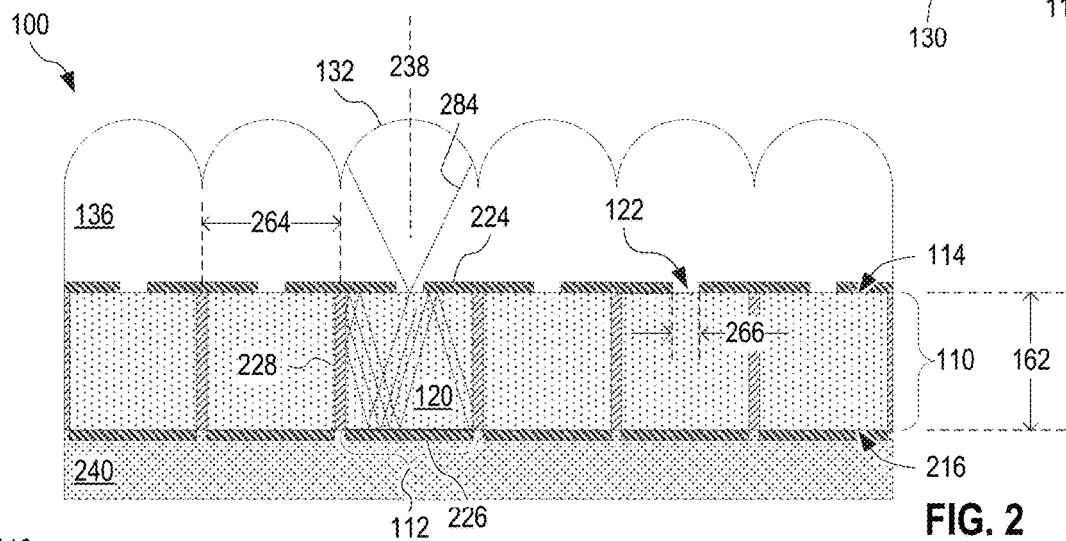
Figure 3:
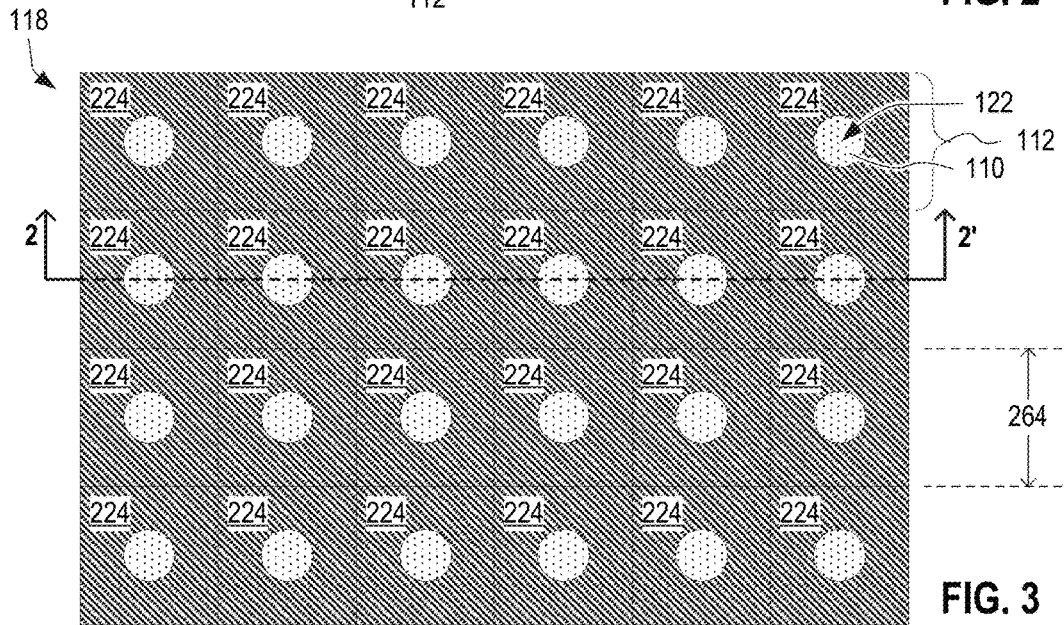

FIGS. 1, 2, and 3 illustrate one light trapping image sensor 100. FIG. 1 is a cross-sectional view of image sensor 100 in an example use scenario. FIG. 2 shows image sensor 100 in further detail. FIG. 3 is a top view of a pixel array of image sensor 100. The cross sections of image sensor 100 depicted in FIGS. 1 and 2 are taken along line 2-2' in FIG. 3. FIGS. 1, 2, and 3 are best viewed together in the following description.

Image sensor 100 includes a semiconductor substrate 110 and a lens array 130 disposed over a light-receiving top surface 114 of semiconductor substrate 110. Image sensor 100 is a backside-illuminated complementary metal oxide semiconductor (CMOS) image sensor that includes an array of photosensitive pixels 112 formed in and on semiconductor substrate 110. Without departing from the scope hereof, image sensor 100 may include fewer or more pixels 112 than shown in FIGS. 1, 2, and 3.

Each pixel 112 converts light 182 incident on pixel 112 to an electrical output signal 188. Each pixel 112 includes a reflective material that forms a cavity 120 around a portion of the semiconductor material of semiconductor 110 to at least partly trap light 182 that has entered cavity 120. Light enters cavity 120 through an aperture 122 in a ceiling 224 formed by the reflective material at top surface 114. Although depicted in FIG. 3 as having circular cross section, apertures 122 may have a different shape, for example square, without departing from the scope hereof.

When light 182 is of a wavelength where the internal quantum efficiency of semiconductor substrate 110 is low, the average path length that a photon of light 182 must travel in order to be converted to an electrical charge may greatly exceed to the thickness of semiconductor substrate 110. For example, the absorption coefficient of silicon is $\alpha_{1060}=10$ cm$^{-1}$ at 1060 nanometers (near-infrared) and $\alpha_{535}=10{,}000$ cm$^{-1}$ at 535 nanometers (green). As a result, while 535-nanometer light travels only one micron to lose 64% of its intensity to photon-to-charge conversion, 1060-nanometer light must travel one millimeter to lose 64% of its intensity to photon-to-charge conversion. Typically, the thickness of a semiconductor substrate of an image sensor is a few microns, e.g., between 2 and 20 microns, such that only a very small fraction of incident 1060-nanometer light will undergo photon-to-charge conversion while traveling through the thickness of the semiconductor substrate. By virtue of trapping light 182, cavities 120 effectively multiply the semiconductor-substrate-thickness experienced by light 182 that has entered cavities 120. FIG. 2 shows one example ray 284 entering a cavity 120 and being reflected by walls of cavity 120 to make multiple passes through the semiconductor material of semiconductor substrate 110 inside cavity 120. (It is understood that this ray tracing description may not be accurate, and that wave optics may be required to properly describe the light propagation into and inside cavity 120.) The thickness 162 of semiconductor substrate 110 may be in the range between 2 and 20 microns. Yet, cavities 120 may allow path lengths, of light 182 within cavities 120, that is many times greater than thickness 162. Cavities 120 thereby compensate for the low absorption coefficient pertaining to certain wavelength ranges and enhance the quantum efficiency of image sensor 100 in such wavelength ranges, as compared to a conventional image sensor without cavities 120.

In order to enjoy the light-trapping benefit of cavities 120, light 182 must be coupled relatively effectively into cavities 120 through aperture 122, and each aperture 122 must be made as small as possible. For this purpose, lens array 130 is disposed over top surface 114 and includes lenses 132 aligned to apertures 122. Lenses 132 are configured to focus light 182 at least approximately on apertures 122, such that at least a significant portion of light incident on each lens 132 is coupled into a respective cavity 120 even when aperture 122 is small. Each lens 132 may have a high numerical aperture to produce tight focus on aperture 122 to improve light coupling into cavity 120 through aperture 122. In one embodiment, each lens 132 is a plano-convex microlens and may have a numerical aperture of approximately 0.5 or greater (such as between 0.4 and 0.7). In this embodiment, an optical axis 238 of the microlens may be centered on aperture 122. In another embodiment, each lens 132 is a microsphere and may have a numerical aperture of approximately 1.0 (such as between 0.9 and 1.4).

Each pixel 112 may have a square cross section with side length 264, such that the pixel pitch along rows and columns of the array of pixels 112 is the same as side length 264. Each aperture 122 may have a circular cross section with diameter 266, or a square cross section with side length 266. Side length 264 may be in the range between 0.8 microns (approximately the lower limit for satisfactory focusing and light collection performance achievable with presently available microlens manufacturing technology) and 10 microns (corresponding to an upper limit on acceptable resolution of the array of pixels 112 in some scenarios), and diameter/side-length 266 may be in the range between 0.25 microns and half of side length 264. With such dimensions, an accurate description of the light coupling into cavities 120 and light propagation inside cavities 120 must take into account the wave nature of the light. However, for illustrative purposes and without being bound by theory, a simplified description of image sensor 100 may be useful for evaluating the effect of certain parameters of image sensor 100.

For illustrative purposes and without being bound by theory, consider a simplified model of a single pixel 112 and its associated lens 132, and assume that the focal point of lens 132 coincides with aperture 122. In this model, light 182 is refracted by lens 132 to form an Airy pattern on ceiling 224. Ideally, to optimize light coupling into cavity 120, the Airy disk (the central disk of the Airy pattern) is fully within aperture 122, such that diameter/side-length 266 is no less than $$D_{min} = \frac{2(\lambda/n)}{\pi NA},$$ (Eq. 1)

wherein $\lambda$ is the free-space wavelength of light 182, n is the index of refraction of lens 132, and NA is the numerical aperture of lens 132. For a lens 132 with a numerical aperture of 0.5, $D_{min}=1.27\lambda/n$ which, for $\lambda=1060$ nanometers and n=1.5 (typical for a polymer), corresponds to $D_{min}\approx 900$ nanometers. For a lens with a numerical aperture of 1.0, $D_{min}=0.64\lambda/n$ which, for $\lambda=1060$ nanometers and n=1.5, corresponds to $D_{min}\approx 450$ nanometers. In some scenarios, it may be beneficial to operate with a larger diameter/side-length 266 than $D_{min}$ to improve light coupling into cavity 120. In one embodiment, diameter/side-length 266 is no less than $D_{min}$ and no more than a third or half of side length 264. In other scenarios, it may be beneficial to operate with a smaller diameter/side-length 266 than $D_{min}$ to reduce light leakage out of cavity 120 via aperture 122.

In one embodiment, semiconductor substrate 110 is a silicon-based substrate, and image sensor 100 provides quantum efficiency improvement especially in the near-infrared spectrum, where the absorption coefficient of silicon is low. Herein, "near-infrared" refers to light having a wavelength in the range between 700 and 1400 nanometers. In another embodiment, semiconductor substrate 110 is a silicon-germanium-based substrate, and image sensor 100 provides quantum efficiency improvement especially in the near-infrared spectrum, where the absorption coefficient of silicon-germanium is low, although not as low as the absorption coefficient of silicon. In yet another embodiment, semiconductor substrate 110 is an indium-gallium-arsenide-based substrate or a germanium substrate, and image sensor 100 provides quantum efficiency improvement especially in the visible spectrum, where the absorption coefficient of indium-gallium-arsenide and germanium is low.

Regardless of the material choice, semiconductor substrate 110 includes doped regions to form a photodiode in each pixel 112. Each pixel 112 may further include one or more transistors or gates for conducting photo-generated electric charge out of pixel 112 to produce signal 188.

Lens array 130 is implemented in a light transport layer 136 disposed over top surface 114 on ceilings 224 and spanning over apertures 122. Light transport layer 136 may include one or more wavelength filters. In one embodiment, image sensor 100 is a monochrome image sensor. In this embodiment, light transport layer 136 may be substantially optically clear in a desired operating wavelength range, optionally while blocking light outside the desired operating wavelength range. In one example, light transport layer 136 is configured to transmit near-infrared light and block visible light. In another example, light transport layer 136 is configured to transmit both visible and near-infrared light. In another embodiment, image sensor 100 is a color image sensor, wherein pixels 112 include a plurality of groups of pixels 112 dedicated to detecting light of a respective plurality of colors, such as red, green, blue, and near-infrared. In this embodiment, light transport layer 136 may include a color filter array between lens array 130 and top surface 114, or incorporated in lenses 132.

FIG. 1 depicts image sensor 100 in an example use scenario, wherein image sensor 100 is deployed in a camera 102 set up to image a scene 180 at night, and semiconductor substrate 110 is a silicon-based substrate. Camera 102 is configured to capture images of a scene 180, through detection of near-infrared light from scene 180. Thus, in the depicted example use scenario, light 182 is in the near-infrared spectrum. Camera 102 includes image sensor 100 and an imaging objective 170. Imaging objective 170 may be a single lens or a composite lens system that includes a plurality of optical elements. Night imaging based on near-infrared light is typically a low-light scenario, and silicon has a low absorption coefficient in the near-infrared spectrum. It may therefore be challenging to achieve sufficient image brightness with a reasonably short exposure time. Camera 102 benefits from the enhanced quantum efficiency of image sensor 100 to be capable of at least partly compensating for the low absorption coefficient of silicon and a low level of near-infrared light available for imaging. In one implementation, camera 102 is a monochrome night-vision camera configured to image near-infrared light. In another implementation, camera 102 is a color camera configured to capture both color images and near-infrared images, using respective subsets of pixels 112.

For each pixel 112, the reflective material, forming cavity 120, forms ceiling 224, a floor 226, and sidewalls 228. Floor 226 may be at a bottom surface 216 of semiconductor substrate 110 facing in the direction opposite of top surface 114. Each of ceiling 224, floor 226, and sidewalls 228 may include metal, such as aluminum, and/or a low-index-of-refraction (low-n) dielectric, such as an oxide (e.g., silicon dioxide) or a polymer. Herein, a "low-n dielectric" refers to a dielectric material having an index of refraction that is less than 1.6. Ceiling 224, floor 226, and sidewalls 228 may be separate from each other and/or two or more of ceiling 224, floor 226, and sidewalls 228, may have different respective material compositions. In one implementation, sidewalls 228 are or include deep-trench isolation that electrically isolates adjacent pixels 112 from each other. In this implementation, one set of sidewalls 228 of image sensor 100 may form a plurality of continuous walls, each running between adjacent rows of the array of pixels 112 in FIG. 3, and another set of sidewalls 228 may form a plurality of continuous walls, each running between adjacent columns of the array of pixels 112 in FIG. 3.

In one embodiment, the surface of floor 226 facing cavity 120, and optionally also the surface of ceiling 224 facing cavity 120, has a jagged profile to at least partly randomize the propagation of light 182 inside cavity 120 so as to improve light trapping by cavity 120. In one example of this embodiment, floor 226 and, optionally also ceiling 224, includes pyramid-like features protruding into cavity 120. In another example of this embodiment, floor 226, and optionally also ceiling 224, includes surfaces that are at an oblique angle to thickness 162.

Image sensor 100 may include a connection layer 240 disposed below bottom surface 216 on floors 226. Connection layer 240 includes electrical connections to pixels 112 that are used to conduct electrical signals 188 to external connections (not shown in FIGS. 1, 2, and 3). In one embodiment, each floor 226 is at least in part a metal electrode that serves both to (a) reflect light propagating inside cavity 120 and (b) participate in readout of electrical signals 188 from pixels 112.

Figure 4A:
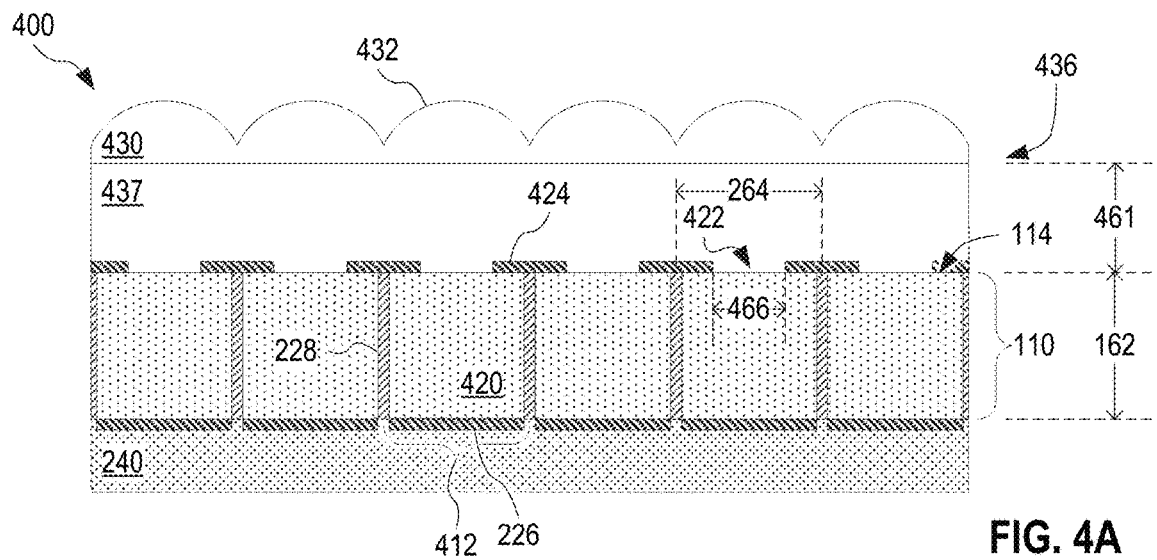
FIGS. 4A and 4B illustrate a light-trapping image sensor equipped with a 100% fill-factor microlens array, according to an embodiment.
Figure 4B:
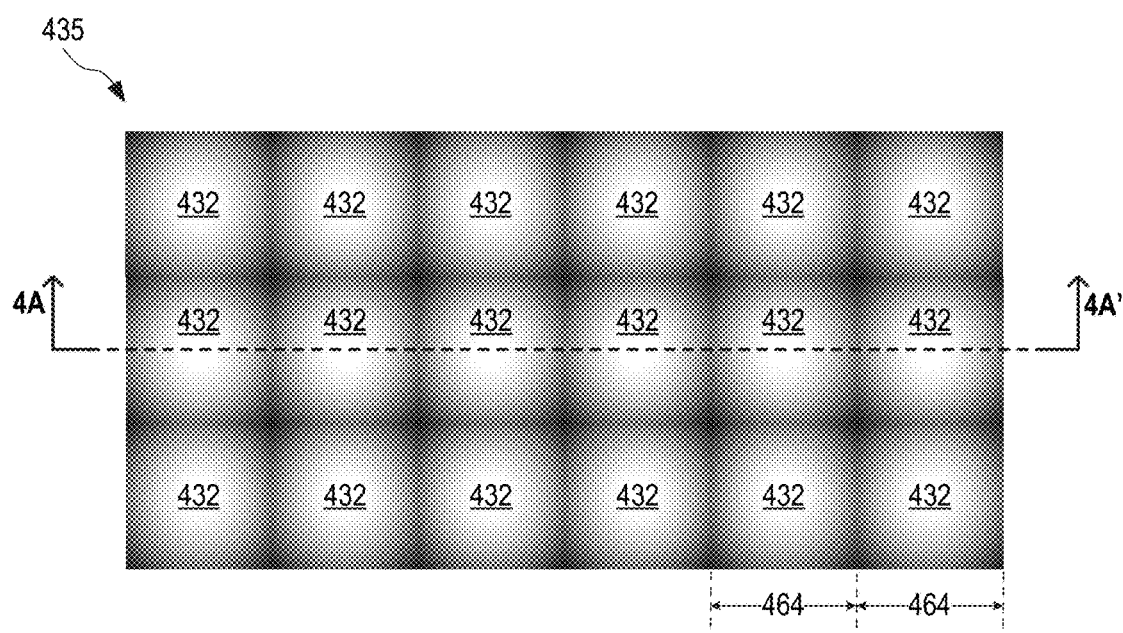

FIGS. 4A and 4B illustrate one light-trapping image sensor 400 equipped with a 100% fill-factor microlens array. FIG. 4A is a cross-sectional view of image sensor 400, and FIG. 4B is a top view of an array of pixels of image sensor 400. The cross section in FIG. 4A is taken along line 4A-4A' in FIG. 4B. FIGS. 4A and 4B are best viewed together in the following description. Without departing from the scope hereof, image sensor 400 may include more or fewer pixels than depicted in FIGS. 4A and 4B. Herein, a fill factor of 100% refers to a lens array that does not have a gap between adjacent lenses. It is understood, however, that deviations from the desired lens surface profiles may exist at the boundary between adjacent lenses, such that only, e.g., 95-99% of the lens array area is fully functional.

Image sensor 400 is an embodiment of image sensor 100 that includes semiconductor substrate 110, an array of pixels 412 formed in and on semiconductor substrate 110, and a light transport layer 436. Each pixel 412 is an embodiment of pixel 112 having a cavity 420. Each pixel 412 has a side length 264 that may be in the range between 0.8 microns and 10 microns. The pixel pitch of pixels 412 is identical to side length 264. Cavity 420 is an embodiment of cavity 120 that implements ceiling 124 and a ceiling 424 which forms an aperture 422 to allow light 182 to enter cavity 420. Light transport layer 436 is an embodiment of light transport layer 136 that includes a microlens array 430 (an embodiment of lens array 130) of plano-convex microlenses 432 disposed on an intermediate layer 437 that, in turn, is disposed on top surface 114 over ceilings 424 of pixels 412. Intermediate layer 437 and microlenses 432 are configured such that each microlens 432 focuses light 182 approximately at aperture 422. However, microlenses do not have a high numerical aperture and therefore do not focus light 182 very tightly, as indicated by Eq. 1 where $D_{min}$ is inversely proportional to the numerical aperture. Thus, to allow entry into cavity 420 of a substantial portion of light focused by microlenses 432, the transverse extent 466 (e.g., diameter or side length) of aperture 422 must be relatively large. In one example, the numerical aperture of each microlens 432 is 0.25, such that $D_{min}=2.55\lambda/n$ which, for $\lambda=1060$ nanometers and $n=1.5$, corresponds to $D_{min}\approx1800$ nanometers.

Figure 5A:
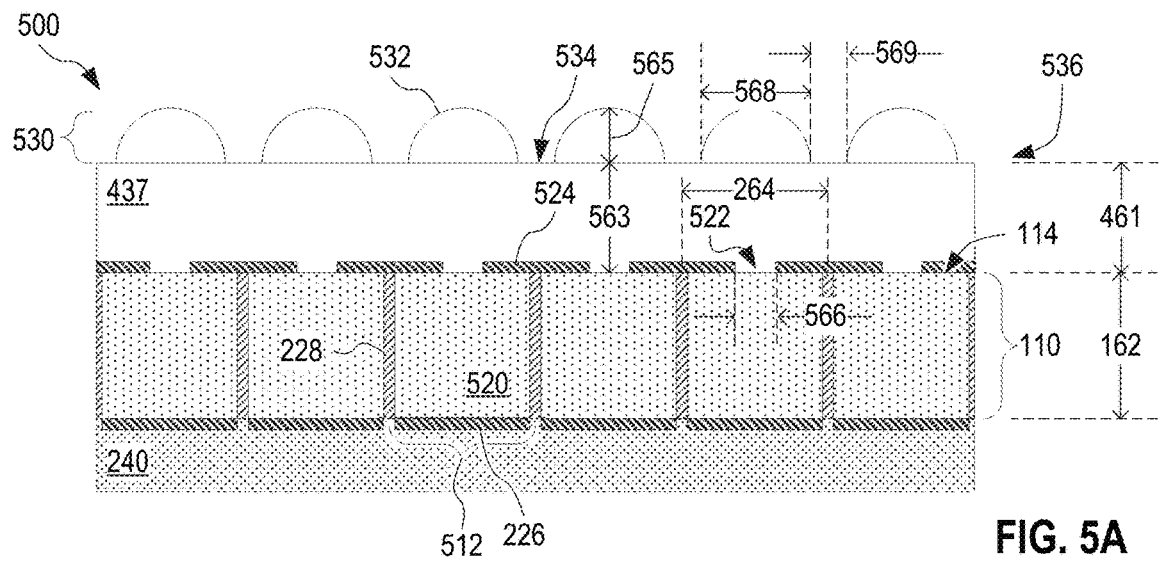
FIGS. 5A and 5B illustrate a light-trapping image sensor equipped with a sub-100% fill-factor microlens array, according to an embodiment.
Figure 5B:
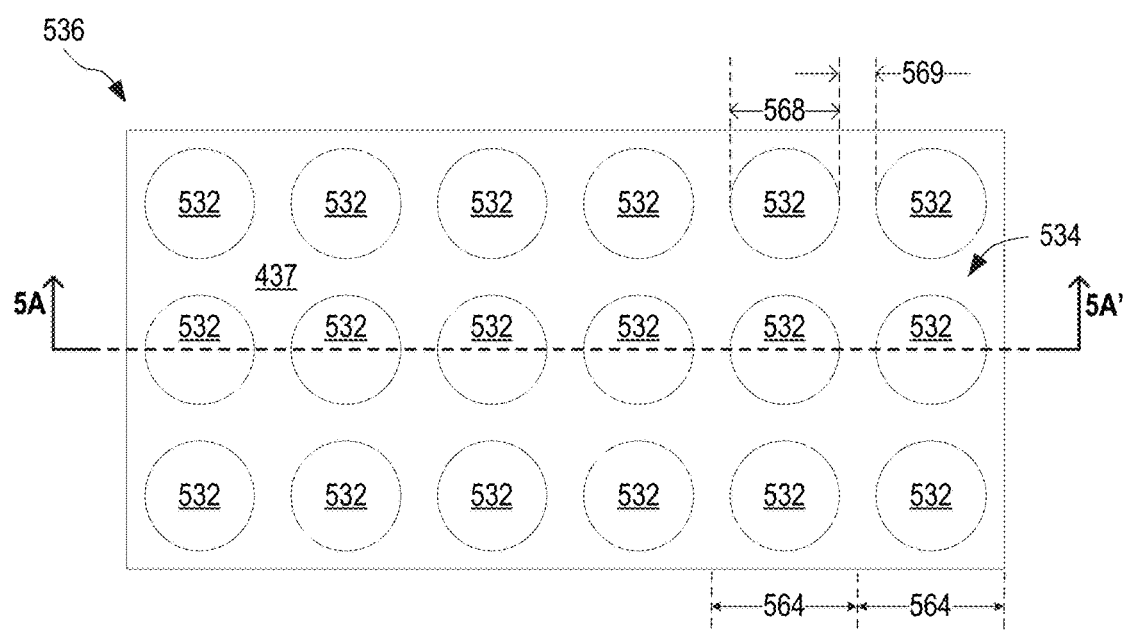

FIGS. 5A and 5B illustrate one light-trapping image sensor 500 equipped with a sub-100% fill-factor microlens array. FIG. 5A is a cross-sectional view of image sensor 500, and FIG. 5B is a top view of an array of pixels of image sensor 500. The cross section in FIG. 5A is taken along line 5A-5A' in FIG. 5B. FIGS. 5A and 5B are best viewed together in the following description. Image sensor 500 is an embodiment of image sensor 100. Without departing from the scope hereof, image sensor 500 may include more or fewer pixels than depicted in FIGS. 5A and 5B.

Image sensor 500 is similar to image sensor 400 except that (a) microlens array 430 is replaced by a microlens array 530 of plano-convex microlenses 532, and (b) pixels 412 are replaced by pixels 512. Each pixel 512 is similar to pixel 412 except for having a different cavity-ceiling configuration. Each pixel 512 forms a cavity 520 with a ceiling 524 that forms an aperture 522 with transverse extent 566 (e.g., diameter or side length). Microlenses 532 have been shrunk, relative to microlenses 432, to achieve a higher numerical aperture. The thickness 563 of intermediate layer 437 is such that the focal point of each microlens 532 is at the corresponding aperture 522. By virtue of the higher numerical aperture of microlenses 532, transverse extent 566 may be made smaller than transverse extent 466 while ensuring satisfactory light coupling into cavities 520. Each microlens 532 has a diameter 568 and a height 565. In one example, each microlens 532 is a spherical lens (that is, the surface profile of the convex lens surface of microlenses 532 is spherical), height 565 is approximately half of diameter 568, and the refractive index of microlens 532 is approximately 1.5. In this example, per the equations NA=D/(2f) and f=R/(n−1) (wherein D and f are the diameter and focal length, respectively, of microlens 532, and R is the radius of curvature of the convex surface of microlens 532), the numerical aperture of each microlens 532 is 0.5. According to Eq. 1, in this example, $D_{min}$=1.27λ/n which, for λ=1060 nanometers, corresponds to $D_{min}$≈900 nanometers. This is a substantial improvement over image sensor 400. As compared to image sensor 400, image sensor 500 facilitates an improved trade-off between (i) efficiency of light coupling into cavities 520 and (ii) the light-trapping performance of cavities 520. In one embodiment, transverse extent 564 is in the range between 500 nanometers and one half of the pixel pitch (side length 264) of pixels 512.

As a result of the shrinking of microlenses 532, the fill factor of microlenses array 530 is less than 100%. Microlenses 532 are spaced apart from each other, such that each adjacent pair of microlenses 532 have a planar surface portion 534 of intermediate layer 437 therebetween. Nearest-neighbor microlenses 532 has a minimum separation 569 therebetween. Separation 569 is a non-zero distance, and diameter 568 is less than side length 264 (pixel pitch) of pixels 512. Even though the light collection efficiency of microlenses array 530 suffers from the fill factor being less than 100%, the improved performance of cavities 520 outweighs this loss to provide an enhancement in quantum efficiency over image sensor 400.

Figure 6A:
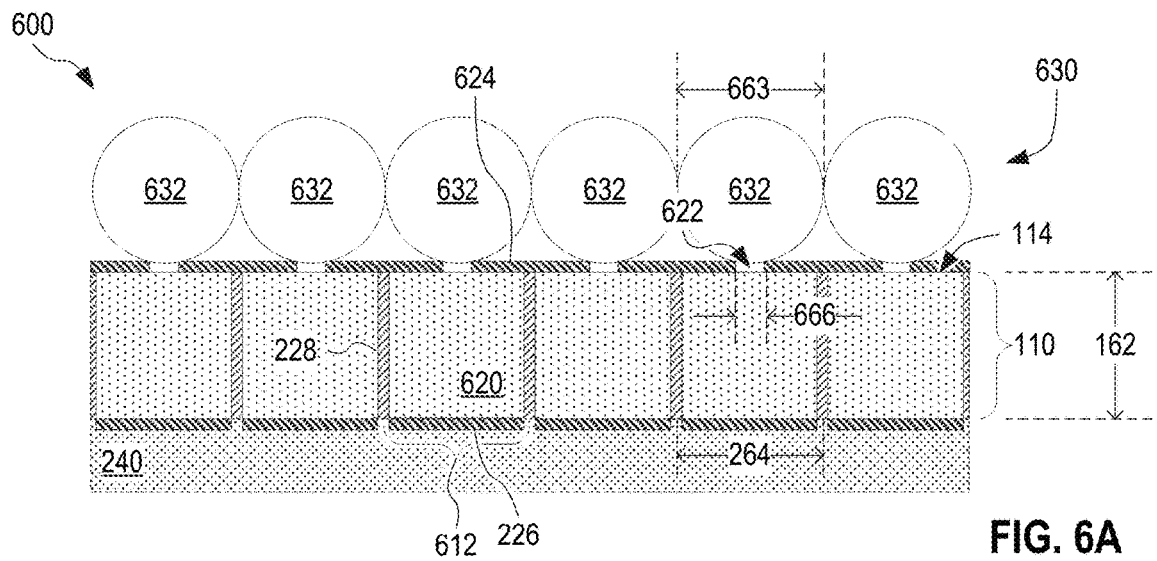
FIGS. 6A and 6B illustrate a light-trapping image sensor with a microsphere array, according to an embodiment.
Figure 6B:
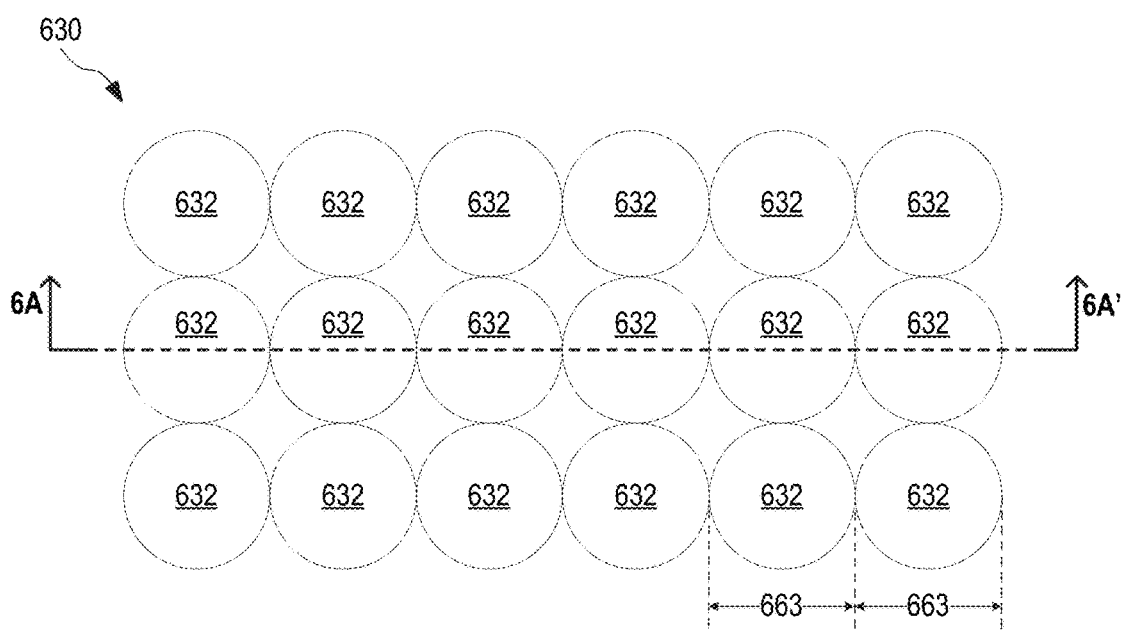

FIGS. 6A and 6B illustrate one light-trapping image sensor 600 with a microsphere array 630. FIG. 6A is a cross-sectional view of image sensor 600, and FIG. 6B is a top view of microsphere array 630. The cross section in FIG. 6A is taken along line 6A-6A' in FIG. 6B. FIGS. 6A and 6B are best viewed together in the following description. Image sensor 600 is an embodiment of image sensor 100. Without departing from the scope hereof, image sensor 600 may include more or fewer pixels than depicted in FIGS. 6A and 6B.

Image sensor 600 is similar to image sensor 500 except that (a) light transport layer 536 is replaced by microsphere array 630, and (b) pixels 512 are replaced by pixels 612. Each pixel 612 is similar to pixel 512 except for forming a cavity 620 with a ceiling 624 that forms an aperture 622 with transverse extent 666 (e.g., diameter or side length). Microsphere array 630 is an embodiment of lens array 130 and includes an array of microspheres 632. The back focal length of each microsphere 632 is short and may, to a first approximation, be assumed to be near-zero. Therefore, each microsphere 632 is disposed directly on a respective pixel 612, centered on aperture 622. Per the equations NA=D/(2f) and f=R/[2(n−1)] (wherein D, f, and R are the diameter, focal length, and radius, respectively, of microsphere 632), the numerical aperture of each microsphere 632 is NA=2(n−1). In one example, the refractive index of microsphere 632 is n=1.5 and the numerical aperture of microsphere 632 is therefore 1.0. In this example, $D_{min}$≈450 nanometers at λ=1060 nanometers. As compared to image sensor 500, microsphere array 630 of image sensor 600 thus facilitates further improvement in the trade-off between (i) efficiency of light coupling into cavities 620 and (ii) the light-trapping performance of cavities 620. In an embodiment, transverse extent 666 is greater than 250 nanometers and less than one third of the pixel pitch.

In one embodiment, the diameter 663 of each microsphere 632 approximately matches side length 264 (pixel pitch) of pixels 612. In this embodiment, diameter 663 may be in the range between 90% and 100% of side length 264, and microsphere array 630 may be formed by depositing a colloidal suspension of microspheres onto semiconductor substrate 110. In another embodiment, diameter 663 is between 50% and 90% of side length 264. In this embodiment, microsphere array 630 may be molded before placing the fully formed microsphere array 630 on the array of pixels 612. Even though the fill factor of microsphere array 630 is less than 100% and microsphere array 630 therefore does not collect all light incident on image sensor 600, the improved performance of cavities 620 outweighs the loss in light collection efficiency to provide an enhancement in quantum efficiency over both image sensor 400 and image sensor 500.

Each aperture 622 may be empty between semiconductor substrate 110 and the corresponding microsphere 632. In an alternative embodiment, each aperture 622 may be filled with a clear material, such as a low-n dielectric that allows light 182 to enter cavity 620 while back-reflecting light propagating in cavity 620 when such light is incident on the low-n dielectric at an angle that is shallower than the critical angle for total internal reflection.

Figure 7A:
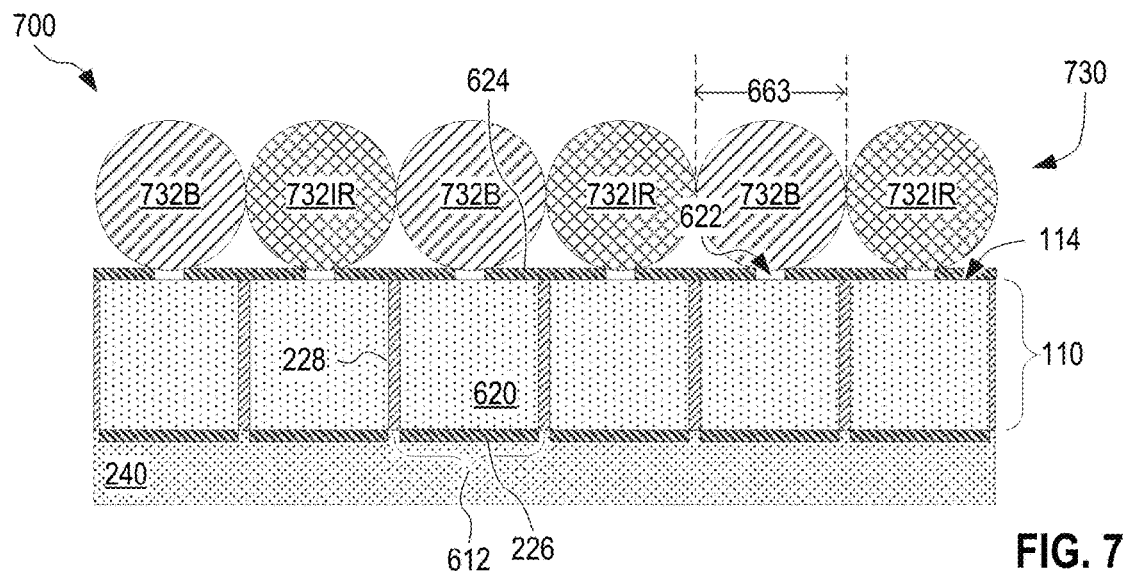
FIGS. 7A and 7B illustrate a light-trapping color image sensor with a color-filtering microsphere array, according to an embodiment.
Figure 7B:
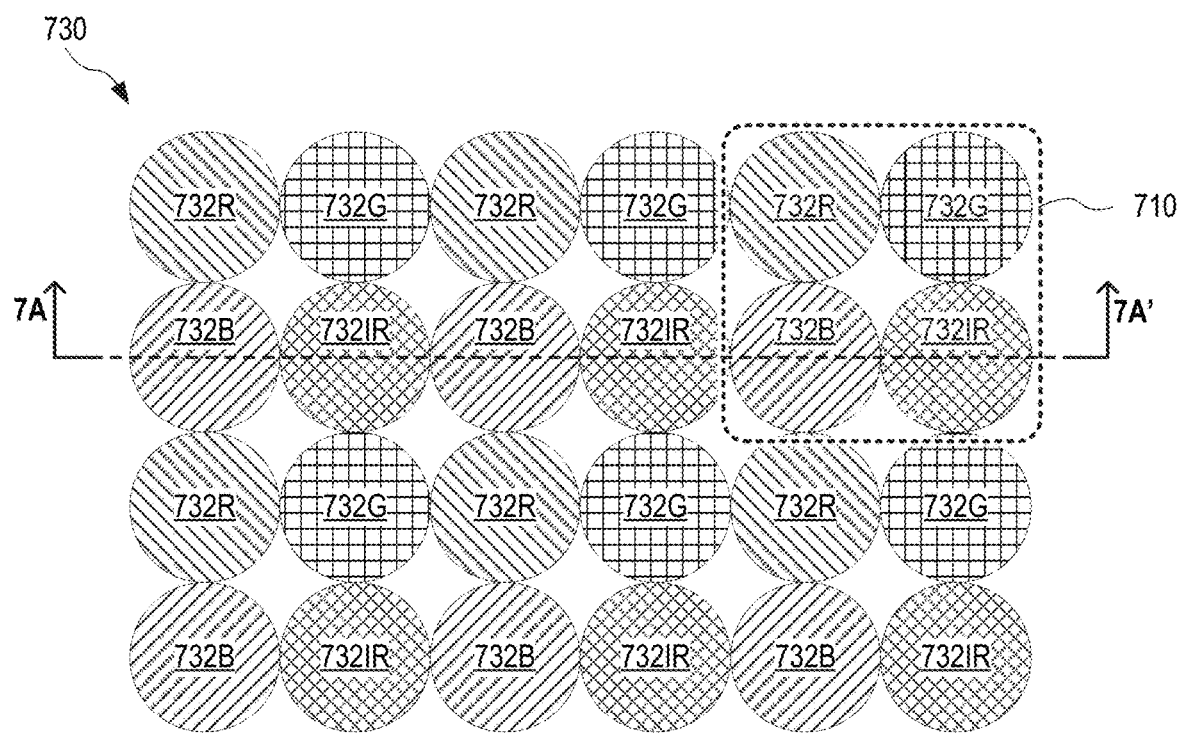

FIGS. 7A and 7B illustrate one light-trapping color image sensor 700 with a color-filtering microsphere array 730. FIG. 7A is a cross-sectional view of image sensor 700, and FIG. 7B is a top view of microsphere array 730. The cross section in FIG. 7A is taken along line 7A-7A' in FIG. 7B. FIGS. 7A and 7B are best viewed together in the following description. Without departing from the scope hereof, image sensor 700 may include more or fewer pixels than depicted in FIGS. 7A and 7B.

Image sensor 700 is an embodiment of image sensor 600 that implements microsphere array 630 as color-filtering microsphere array 730. Color-filtering microsphere array 730 includes a plurality of microspheres 732R, 732G, 732B, and 73218, selectively transmissive to red, green, blue, and near-infrared light, respectively. Each of microspheres 732R, 732G, 732B, and 7321R is an embodiment of microsphere 632 that includes or is composed of a color filtering material. Color-filtering microsphere array 730 arranges microspheres 732R, 732G, 732B, and 7321R in an array of identical microsphere groups 710, each including one microsphere 732R, one microsphere 732G, one microsphere 732B, and one microsphere 7321R.

Without departing from the scope hereof, color-filtering microsphere array 730 may be configured to selective transmit a different set of wavelength ranges than red, green, blue, and near-infrared. More generally, color-filtering microsphere array 730 includes an array of identical microsphere groups, each including a plurality of microspheres selectively transmissive to light in a respective plurality of different wavelength ranges.

Figure 8A:
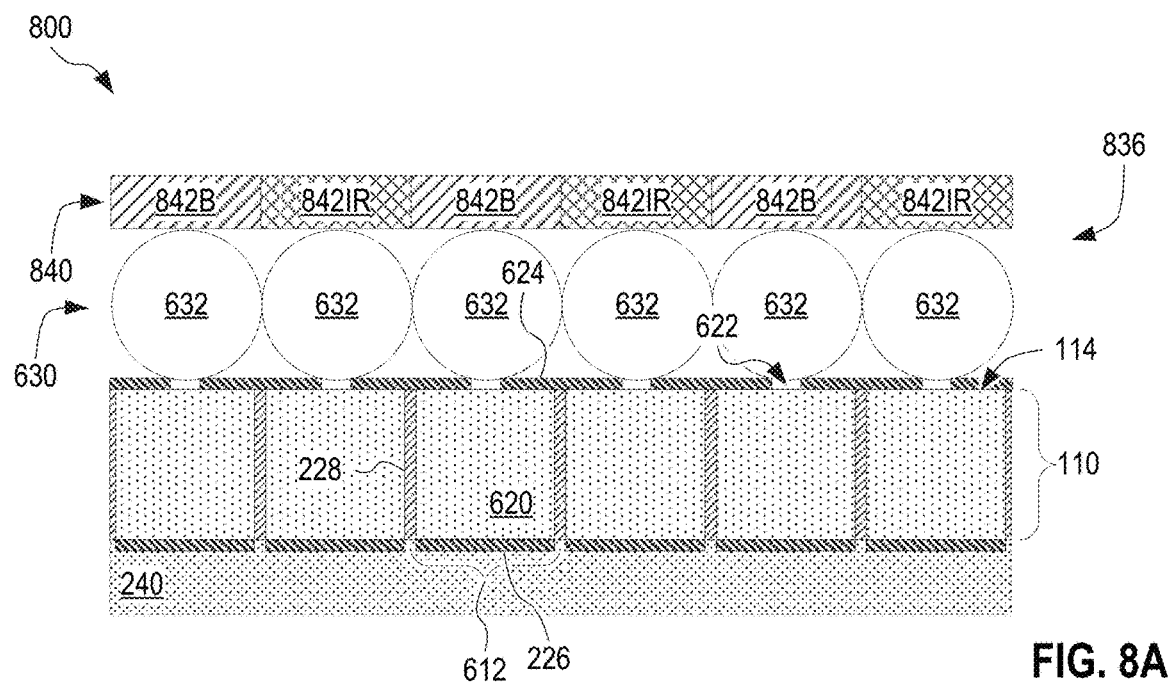
FIGS. 8A and 8B illustrate a light-trapping color image sensor with separate microsphere and color filter arrays, according to an embodiment.
Figure 8B:
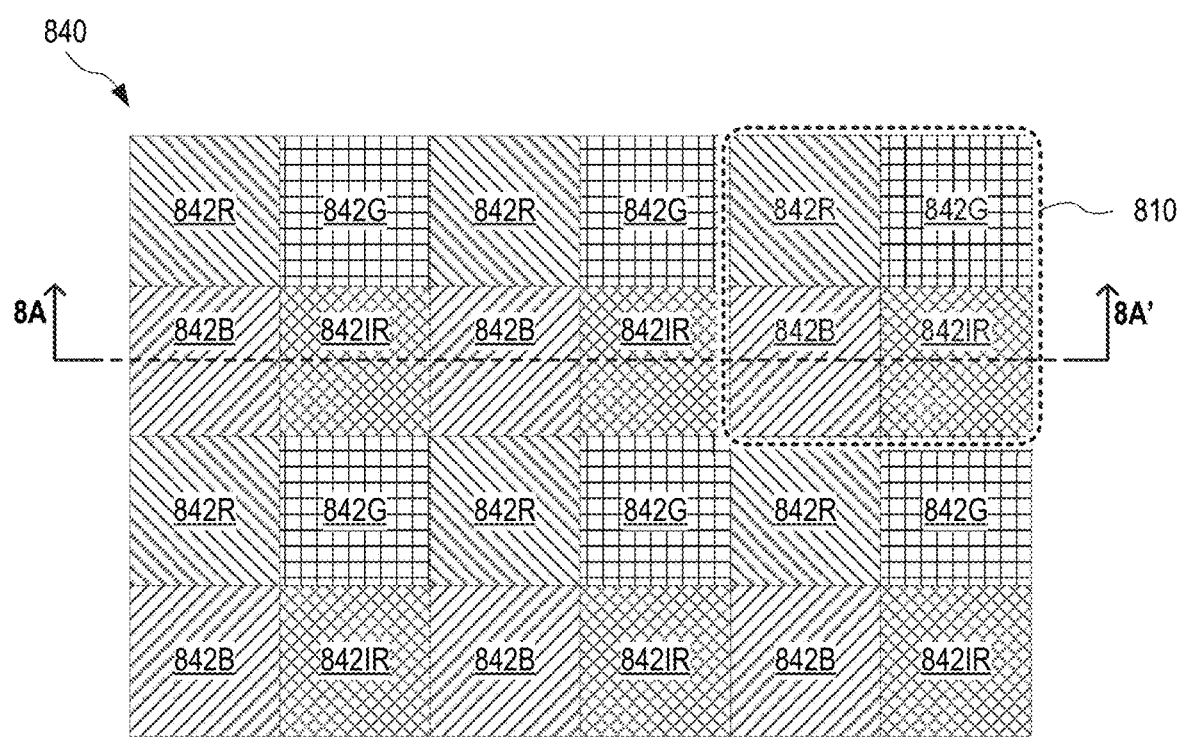

FIGS. 8A and 8B illustrate one light-trapping color image sensor 800 with separate microsphere and color filter arrays. FIG. 8A is a cross-sectional view of image sensor 800, and FIG. 8B is a top view of a color filter array 840 of image sensor 800. The cross section in FIG. 8A is taken along line 8A-8A' in FIG. 8B. FIGS. 8A and 8B are best viewed together in the following description. Without departing from the scope hereof, image sensor 800 may include more or fewer pixels than depicted in FIGS. 8A and 8B.

Image sensor 800 is an embodiment of image sensor 600 that further includes a color filter array 840, and wherein all microsphere 632 are identical and substantially transmissive to light throughout the operating wavelength range of image sensor 800. Due to the short (near-zero) back focal length of microspheres 632, color filter array 840 does not fit between microsphere array 630 and the array of pixels 612. Instead, color filter array 840 is disposed on top of microsphere array 630, such that microsphere array 630 is sandwiched between color filter array 840 and the array of pixels 612.

Color-filter array 840 includes a plurality of color filters 842R, 842G, 842B, and 84218, selectively transmissive to red, green, blue, and near-infrared light, respectively. Each color filter of color filter 840 is registered to a respective microsphere 632 of microsphere array 630. Color-filter array 840 arranges color filters 842R, 842G, 842B, and 8421R in an array of identical color filter groups 810, each including one color filter 842R, one color filter 842G, one color filter 842B, and one color filter 8421R.

Without departing from the scope hereof, color filter array 840 may be configured to selective transmit a different set of wavelength ranges than red, green, blue, and near-infrared. More generally, color filter array 840 includes an array of identical color filter groups, each including a plurality of color filters selectively transmissive to light in a respective plurality of different wavelength ranges.

Figure 9A:
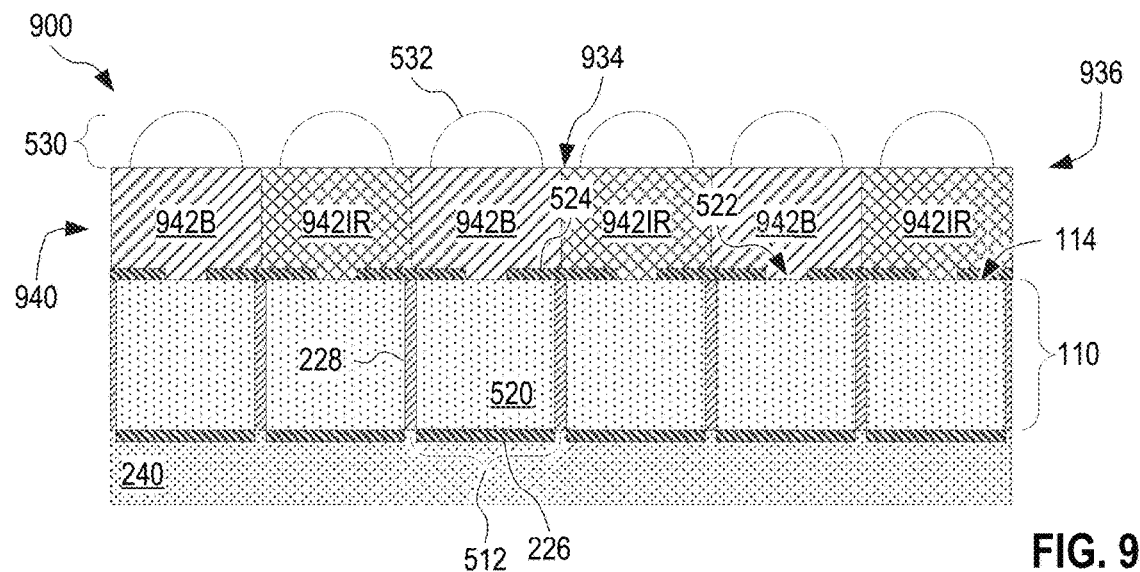
FIGS. 9A and 9B illustrate a light-trapping color image sensor with separate microlens and color filter arrays, according to an embodiment.
Figure 9B:
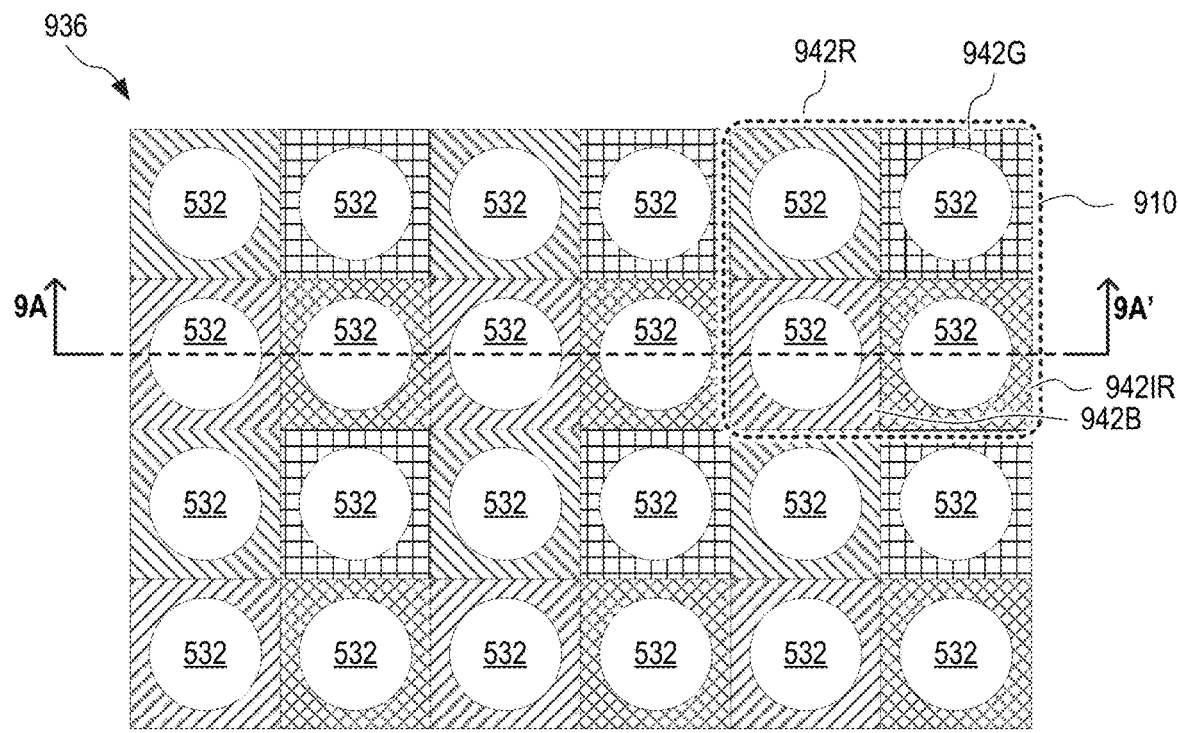

FIGS. 9A and 9B illustrate one light-trapping color image sensor 900 with separate microlens and color filter arrays. FIG. 9A is a cross-sectional view of image sensor 900, and FIG. 9B is a top view of a color-filtering light transport layer 936 of image sensor 900. The cross section in FIG. 9A is taken along line 9A-9A' in FIG. 9B. FIGS. 9A and 9B are best viewed together in the following description. Without departing from the scope hereof, image sensor 900 may include more or fewer pixels than depicted in FIGS. 9A and 9B.

Image sensor 900 is an embodiment of image sensor 500 wherein light transport layer 536 is implemented as color-filtering light transport layer 936. Color-filtering light transport layer 936 implements intermediate layer 437 as a color filter array 940. Color filter array 940 includes a plurality of color filters 942R, 942G, 942B, and 9421R, selectively transmissive to red, green, blue, and near-infrared light, respectively. Each color filter of color filter 940 is registered to a respective pixel 512. Color-filter array 940 arranges color filters 942R, 942G, 942B, and 9421R in an array of identical color filter groups 910, each including one color filter 942R, one color filter 942G, one color filter 942B, and one color filter 94218.

Without departing from the scope hereof, color filter array 940 may be configured to selective transmit a different set of wavelength ranges than red, green, blue, and near-infrared. More generally, color filter array 940 includes an array of identical color filter groups, each including a plurality of color filters selectively transmissive to light in a respective plurality of different wavelength ranges.

Figure 10:
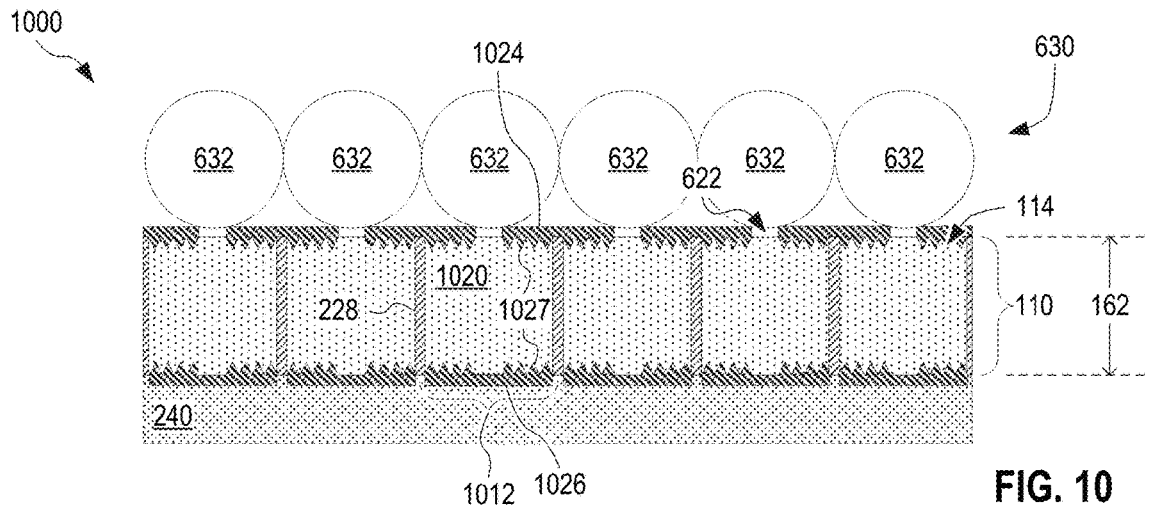
FIG. 10 illustrates a light-trapping image sensor with cavity ceilings and floors having a jagged surface profile to introduce randomization of light propagation inside the cavities, according to an embodiment.

FIG. 10 illustrates, in cross-sectional view, one light-trapping image sensor 1000 with cavity ceilings and floors having a jagged surface profile to introduce randomization of light propagation inside the cavities. Such randomization may improve light trapping in the cavities. Image sensor 1000 is an embodiment of image sensor 600 that implements each pixel 612 as a pixel 1012. Each pixel 1012 has a cavity 1020 with a ceiling 1024, a floor 1026, and sidewalls 228. Cavity 1020, ceiling 1024, and floor 1026 are embodiments of cavity 620, ceiling 624, and floor 226, respectively. Ceiling 1024 forms aperture 622. In each pixel 1012, at least a portion 1027 of the surface of each of ceiling 1024 and floor 1026 is jagged to randomize the reflection of light off ceiling 1024. In one example, the jagged surface profile is achieved by a plurality of pyramids extending into cavity 1020. More generally, the jagged surface profile includes a plurality of surfaces that are at different oblique angles to thickness 162. In one embodiment, sidewalls 228 are smooth, at least because it is challenging to form a jagged surface profile on sidewalls 228.

Although FIG. 10 shows both ceiling 1024 and floor 1026 being jagged in places, image sensor 1000 may instead implement only one of ceiling 1024 and floor 1026 with jagged surface profile, without departing from the scope hereof. Although FIG. 10 shows only a portion of floor 1026 being jagged, all of floor 1026 may have a jagged surface profile facing cavity 1020, without departing from the scope hereof. Also without departing from the scope hereof, jagged features may be formed at least in part by a clear material (such as a low-n dielectric), in which case, the jagged features may span across aperture 622.

Figure 11:
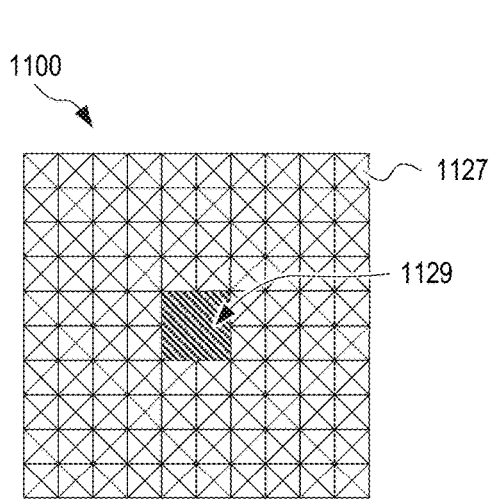
FIG. 11 illustrates a cavity wall having a plurality of pyramids protruding into the cavity, according to an embodiment.

FIG. 11 illustrates, in top plan view, a cavity wall 1100 having a plurality of pyramids 1127 protruding into the cavity. Cavity wall 1100 is an embodiment of either one of ceiling 1024 and floor 1026. Pyramids 1127 may span all of cavity wall 1100 or only a portion of cavity wall 1100. In one example, cavity wall 1100 is a cavity floor, and a central portion 1129 of cavity wall 1100 is free of pyramids 1127 to instead accommodate one or more gates for transferring photo-generated charge out of cavity 1020.

Figure 12:
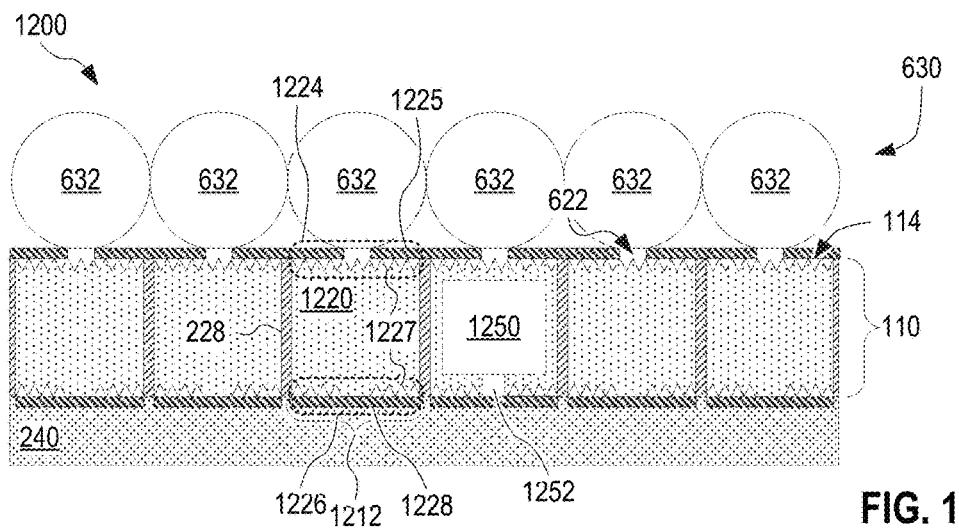
FIG. 12 illustrates a light-trapping image sensor with low-n dielectric pyramids extending into the cavities, according to an embodiment.

FIG. 12 illustrates one light-trapping image sensor 1200 with low-n dielectric pyramids extending into the cavities. Image sensor 1200 is an embodiment of image sensor 1000 implementing and embodiment of cavity wall 1100 as both the cavity floor and the cavity ceiling. Image sensor 1200 includes a plurality of pixels 1212 (embodiments of pixels 1012). Each pixel 1212 forms a cavity 1220 with a ceiling 1224 and a floor 1226. Ceiling 1224 includes a metal layer 1225 and low-n dielectric pyramids 1227 (examples of pyramids 1127) protruding into cavity 1220. Pyramids 1227 span across aperture 622 and serve to reduce back-reflection of light incident on aperture 622 from microsphere 632. Metal layer 1225 is interrupted by aperture 622 which is filled by low-n dielectric. The bases of pyramids 1227 of ceiling 1224 may be at the surface of metal layer 1225 facing cavity 1220, or the bases of pyramids 1227 may be distanced from metal layer 1225 by a continuous layer of low-n dielectric. Floor 1226 includes a metal layer 1228 and low-n dielectric pyramids 1227 protruding into cavity 1220.

Optionally, as indicated in FIG. 12, a central portion of each floor 1226 is free of pyramids 1227 to instead accommodate one or more gates 1252 for transferring photo-generated charge from a photodiode 1250 out of cavity 1220. For clarity of illustration, gate(s) 1252 and photodiode 1250 are depicted only in one pixel 1212 in FIG. 12. Metal layer 1228 may participate in the readout of photo-generated charge. In one implementation, metal layer 1228 may be interrupted below gate 1252 to allow a contact from gate(s) 1252 to another metal layer of connection layer 240.

In each of ceiling 1224 and floor 1226, the low-n dielectric material back reflects light incident at an angle that is shallower than the critical angle for total internal reflection. When semiconductor substrate 110 is a silicon-based substrate and the index of refraction of the low-n dielectric material is 1.45, the critical angle for total internal reflection is approximately 25 degrees (with respect to the surface normal). Thus, for a majority of incidence angles, the low-n dielectric material will back-reflect light by means of total internal reflection. Light that is incident at steeper angles than the critical angle is instead back-reflected by the metal layers.

Figure 13:
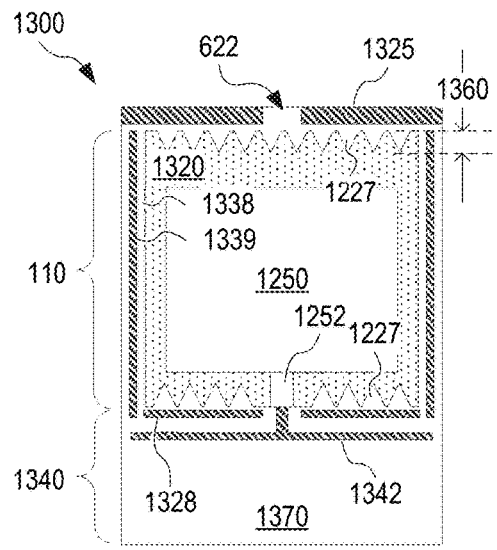
FIG. 13 illustrates a light-trapping pixel that utilizes a combination of low-n dielectric and metal to form a cavity, according to an embodiment.

FIG. 13 illustrates one light-trapping pixel 1300 that utilizes a combination of low-n dielectric and metal to form a cavity 1320. Each wall of cavity 1320 includes metal lined with low-n dielectric. Pixel 1300 is an embodiment of pixel

1212 combined with respective portion of connection layer 240 (shown in FIG. 13 as connection layer portion 1340). Cavity 1320 encloses photodiode 1250. The ceiling of cavity 1320 includes a metal layer 1325 forming aperture 622, and low-n-dielectric that (a) lines the side of metal layer 1325 facing cavity 1320 and (b) forms pyramids 1227. The floor of cavity 1320 includes a metal layer 1328, and low-n-dielectric that (a) lines the side of metal layer 1328 facing cavity 1320 and (b) forms pyramids 1227. The floor of cavity 1320 has no pyramids at a central location where gate(s) 1252 conduct photo-generated charge out of cavity 1320 through an opening in metal layer 1328 to a metal connection 1342. Metal layer 1328 may be connected to a part of gate(s) 1252 to participate in the readout of this photo-generated charge. Each sidewall of cavity 1320 include a metal wall 1339 with a low-n dielectric lining 1338. In an alternative embodiment, pyramids 1227 are replaced by a flat low-n dielectric lining. Each pyramid 1227 may have a depth 1360 in the range between 0.2 and 1.0 microns. In pixel 1300, the low-n dielectric may be an oxide, e.g., silicon dioxide.

Each of pixels 1012, 1212, and 1300, and related embodiments discussed above in reference to FIGS. 10-13, may be implemented in any one of image sensors 400, 500, 600, 700, 800, and 900, without departing from the scope hereof.

Figure 14:
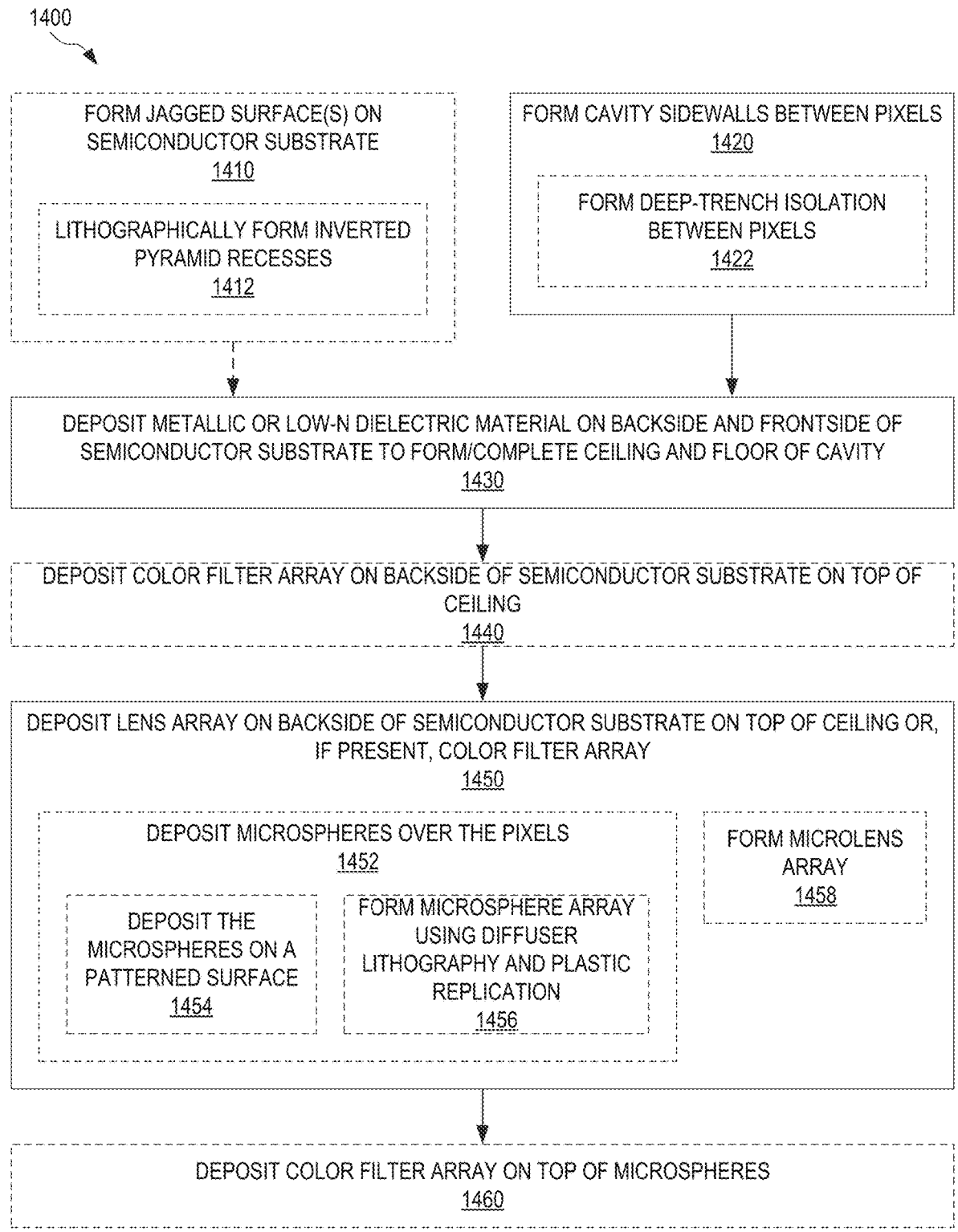
FIG. 14 illustrates a method for manufacturing a light-trapping image sensor, according to an embodiment.

FIG. 14 illustrates one method 1400 for manufacturing light-trapping image sensor 100. Method 1400 includes steps 1420, 1430, and 1450. Method 1400 takes semiconductor substrate 110 as input. Step 1420 forms sidewalls 228 between pixels. Step 1420 may implement a step 1422 of forming the deep-trench isolation between pixels of semiconductor substrate 110, such that this deep-trench isolation forms at least part of sidewalls 228. Step 1430 deposits metallic or low-n dielectric material on the backside and frontside of semiconductor substrate 110 to form at least part of ceiling 224 and floor 226, respectively.

Step 1450 deposits lens array 130 on the backside of semiconductor substrate 110 on top of ceilings 224 or on top of a color filter array (if present) disposed on top of ceilings 224. In one embodiment, step 1450 includes a step 1452 of depositing microspheres 632 over the pixels to form microsphere array 630. Step 1452 may include either one of steps 1454 and 1456. Step 1454 deposits microspheres 632 on a patterned surface, for example as discussed by Mitsui et al. in "Micro demultiplexer fabricated by self-assembly of microspheres on a patterned substrate", 2009, 11th International Conference on Transparent Optical Networks, which is incorporated herein by reference in its entirety. Step 1456 forms the microsphere array using diffuser lithography and plastic replication, for example as discussed by Chang et al. in "Shape-controlled, high fill-factor microlens arrays fabricated by a 3D diffuser lithography and plastic replication method", Optics Express, 2004, Vol. 12, No. 25, pp. 6366-6371, which is incorporated herein by reference in its entirety, whereafter the microsphere array is deposited on semiconductor substrate 110. In another embodiment, step 1450 includes a step 1458 of forming microlens array 430 or 530.

In certain embodiments, step 1430 is preceded by a step 1410 of forming a jagged surface profile on the backside and/or the frontside of semiconductor substrate 110. Step 1410 may include a step 1412 of lithographically forming inverted-pyramid recesses in semiconductor substrate 110, for example by laser interference lithography and a subsequent pattern transfer process using reactive ion etching followed by KOH etching, as outlined in Amalraj Peter Amalathas and Maan M. Alkaisi (May 2nd 2018), "Fabrication and Replication of Periodic Nanopyramid Structures by Laser Interference Lithography and UV Nanoimprint Lithography for Solar Cells Applications, Micro/Nanolithography—A Heuristic Aspect on the Enduring Technology", Jagannathan Thirumalai, IntechOpen, DOI: 10.5772/intechopen.72534, available from https://www.intechopen.com/books/micro-nanolithography-a-heuristic-aspect-on-the-enduring-technology/fabrication-and-replication-of-periodic-nanopyramid-structures-by-laser-interference-lithography-and, which is incorporated herein by reference in its entirety.

Embodiments of method 1400 implementing step 1458, may further include a step 1440, before step 1450, of depositing color filter array 940 on semiconductor substrate 110. Embodiments of method 1400 implementing step 1452, may further include a step 1460, after step 1450, of depositing color filter array 840 on microsphere array 630.

Figure 15:
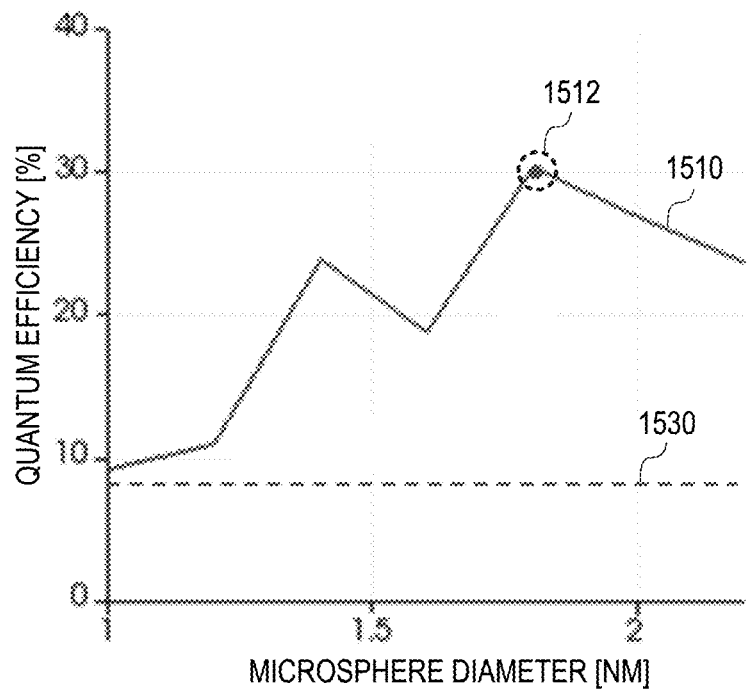
FIG. 15 is a plot of simulated quantum efficiency of an example of the image sensor of FIG. 6.

FIG. 15 plots, as a curve 1510, finite-difference time-domain (FDTD) simulated quantum efficiency at a wavelength of 1060 nanometers as function of diameter 663 of microspheres 632 in one example of image sensor 600 that (a) is characterized by side length 264 (pixel pitch) being 1.1 microns, thickness 162 being 6 microns, the refractive index of microspheres 632 being 1.5, transverse extent 666 being 0.6 microns, and semiconductor substrate 110 being a silicon substrate, and (b) implements each pixel 612 as pixel 1300, wherein metal layers 1325, 1328, and 1338 are aluminum, the low-n dielectric is silicon-dioxide, the ceiling has a 3×3 array of pyramids 1227, and the floor has a 3×3 array of pyramids 1227 with the central pyramid 1227 omitted. Curve 1510 peaks at a quantum efficiency of 30%, achieved at a microsphere diameter of 1.8 microns (see point 1512). For comparison, FIG. 15 also plots, as a line 1530, the corresponding quantum efficiency achieved for an image sensor that does not have light-trapping cavities but is enhanced by a single inverted pyramid per pixel in the light-receiving surface of the silicon substrate to reduce back-reflection. FIG. 15 shows that this example of light-trapping image sensor 600 represents a three-fold improvement over the non-light-trapping image sensor.

Figure 16:
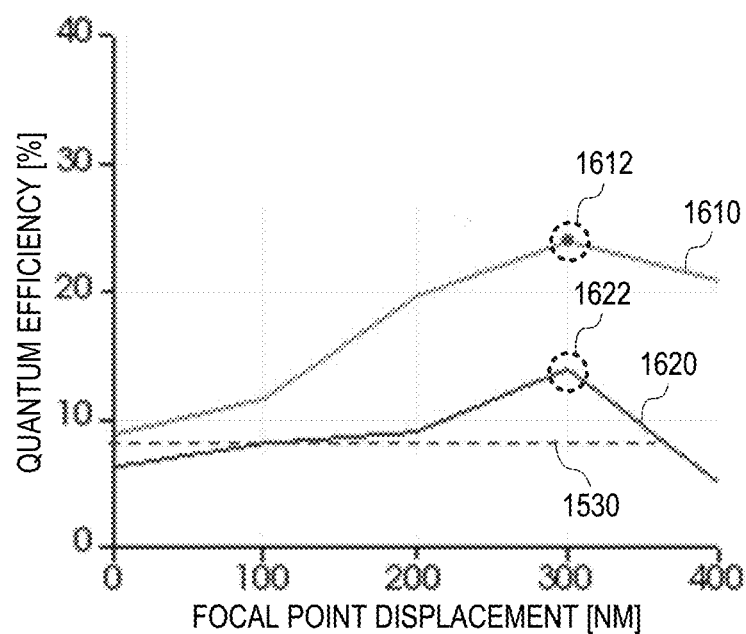
FIG. 16 is a plot of simulated quantum efficiencies of examples of the image sensors of FIGS. 4 and 5.

FIG. 16 plots FDTD-simulated quantum efficiencies at a wavelength of 1060 nanometers for examples of image sensors 400 and 500, as a function of a correction to thickness 461 of intermediate layer 437. Curve 1610 is the FDTD-simulated quantum efficiency for one example of image sensor 500 that (a) is characterized by side length 264 (pixel pitch) being 1.1 microns, thickness 162 being 6 microns, the refractive index of microlenses 532 being 1.5, transverse extent 566 being 0.6 microns, and semiconductor substrate 110 being a silicon substrate, and (b) implements each pixel 512 as pixel 1300, wherein metal layers 1325, 1328, and 1338 are aluminum, the low-n dielectric is silicon-dioxide, the ceiling has a 3×3 array of pyramids 1227, and the floor has a 3×3 array of pyramids 1227 with the central pyramid 1227 omitted. Curve 1620 is the FDTD-simulated quantum efficiency for a corresponding example of image sensor 500. For curve 1610, the fill factor is 78%. For curve 1620, the fill factor is 99%. For comparison, FIG. 16 also plots line 1530 of FIG. 15. FIG. 16 shows that image sensor 500 with a microlens fill factor of 78% outperforms image sensor 400 with a microlens fill factor of 99%, while both image sensor 400 and 500 outperform the non-light-trapping image sensor associated with line 1530. In the FIG. 16 example, the quantum efficiency of image sensor 500 peaks at 13% (see point 1622), and the quantum efficiency of image sensor 400 peaks at 23% (see point 1612). Comparing FIGS. 15 and 16, it is evident that image sensor 600 represents an improvement over both image sensor 400 and image sensor 500, at least in these examples.

Combinations of Features

Features described above as well as those claimed below may be combined in various ways without departing from the scope hereof. For example, it will be appreciated that aspects of one light-trapping image sensor or associated method, described herein, may incorporate features or swap features of another light-trapping image sensor or associated method described herein. The following examples illustrate some possible, non-limiting combinations of embodiments described above. It should be clear that many other changes and modifications may be made to the methods, products, and systems herein without departing from the spirit and scope of this invention:

(A1) One light-trapping image sensor includes a pixel array and a lens array. The pixel array is formed in and on a semiconductor substrate and including photosensitive pixels each including a reflective material forming a cavity around a portion of semiconductor material to at least partly trap light that has entered the cavity. The cavity has a ceiling at a light-receiving surface of the semiconductor substrate, and the ceiling forms an aperture for receiving the light into the cavity. The lens array is disposed on the pixel array. Each lens of the lens array is aligned to the aperture of a respective cavity to focus the light into the cavity through the aperture.

(A2) The image sensor denoted as (A1) may be a backside-illuminated complementary metal oxide semiconductor image sensor, and the semiconductor material may be silicon.

(A3) In either one of the image sensors denoted as (A1) and (A2), each lens may be a microsphere.

(A4) In the image sensor denoted as (A3), each microsphere may be disposed directly on a respective one of the photosensitive pixels.

(A5) In either one of the image sensors denoted as (A3) and (A4), the pixel array may be a rectangular array, wherein the photosensitive pixels have a pixel pitch along rows and columns of the pixel array, and the diameter of each microsphere may be equal to the pixel pitch.

(A6) Any of the image sensors denoted as (A3) through (A5) may be a color image sensor further including a color filter array disposed above the lens array to spectrally filter the light before being focused by the microspheres, wherein the color filter array is an array of identical color filter groups each including a plurality of color filters configured to transmit light in a respective plurality of spectral ranges.

(A7) Any of the image sensors denoted as (A3) through (A5) may be a color image sensor, wherein each microsphere is formed from a color-filtering material to spectrally filter the light while focusing the light, and wherein the lens array is an array of identical microsphere groups each including a plurality of microspheres configured to selectively transmit light in a respective plurality of spectral ranges.

(A8) In either of the image sensors denoted as (A6) and (A7), the semiconductor material may be silicon, and one of the spectral ranges may include near-infrared wavelengths.

(A9) In either of the image sensors denoted as (A1) and (A2), each lens may be a plano-convex microlens with a convex surface for receiving the light into the plano-convex microlens.

(A10) In the image sensor denoted as (A9), the lens array may have less than 100% fill factor such that each plano-convex microlens is separated from each of its adjacent plano-convex microlenses by a non-zero distance.

(A11) In either of the image sensors denoted as (A9) and (A10), focal point of each plano-convex microlens may be at the aperture of the corresponding cavity.

(A12) Any of the image sensors denoted as (A9) through (A11) may be a color image sensor further including a color filter array disposed between the pixel array and the lens array, wherein the color filter array is an array of identical color filter groups each including a plurality of color filters configured to transmit light in a respective plurality of spectral ranges.

(A13) In the image sensor denoted as (A12), the semiconductor material may be silicon, and one of the spectral ranges may include near-infrared wavelengths.

(A14) In any of the image sensors denoted as (A1) through (A13), the ceiling may include metal.

(A15) In any of the image sensors denoted as (A1) through (A14), each cavity may further have a floor, and sidewalls spanning between the floor and the ceiling, wherein, for each cavity, the floor includes a respective metal contact for conducting a photo-generated charge out of the cavity.

(A16) In any of the image sensors denoted as (A1) through (A14), each cavity may further have a floor, and sidewalls spanning between the floor and the ceiling, wherein, for each cavity, the sidewalls include deep trench isolation.

(A17) In the image sensor denoted as (A16), the deep trench isolation may include metal and an oxide layer lining the metal.

(A18) In either of the image sensors denoted as (A16) and (A17), the sidewalls may be shared between adjacent photosensitive pixels such that, where the deep trench isolation is between adjacent first and second photosensitive pixels, the metal or low-index-of-refraction dielectric of the deep trench isolation is lined by a first oxide layer facing the first photosensitive pixel and a second oxide layer facing the second photosensitive pixel.

(A19) In any of the image sensors denoted as (A1) through (A14), each cavity may further have a floor, and sidewalls spanning between the floor and the ceiling, wherein, for each cavity, one or both of the floor and the ceiling are at least partly jagged.

(A20) In the image sensor denoted as (A19), jagged portions of the one or both of the floor and ceiling may have pyramids extending into the semiconductor material enclosed by the cavity.

Changes may be made in the above systems and methods without departing from the scope hereof. It should thus be noted that the matter contained in the above description and shown in the accompanying drawings should be interpreted as illustrative and not in a limiting sense. The following claims are intended to cover generic and specific features described herein, as well as all statements of the scope of the present systems and methods, which, as a matter of language, might be said to fall therebetween.

What is claimed is:

1. A light-trapping image sensor, comprising:
a pixel array formed in and on a semiconductor substrate and including photosensitive pixels each including a reflective material forming a cavity around a portion of semiconductor material to at least partly trap light that has entered the cavity, the cavity having a ceiling at a light-receiving surface of the semiconductor substrate, the ceiling forming an aperture for receiving the light into the cavity;

a lens array disposed on the pixel array, each lens of the lens array being a microsphere aligned to the aperture of a respective cavity to focus the light into the cavity through the aperture; and each microsphere being formed from a color-filtering material to spectrally filter the light while focusing the light, the lens array being an array of identical microsphere groups each including a plurality of microspheres configured to selectively transmit light in a respective plurality of spectral ranges.

2. The image sensor of claim 1, each cavity further having a floor, and sidewalls spanning between the floor and the ceiling, wherein, for each cavity, the sidewalls include deep trench isolation.

3. The image sensor of claim 2, the deep trench isolation including:
   metal; and
   an oxide layer lining the metal.

4. The image sensor of claim 2, the sidewalls being shared between adjacent photosensitive pixels such that, where the deep trench isolation is between adjacent first and second photosensitive pixels, the metal or low-index-of-refraction dielectric of the deep trench isolation is lined by a first oxide layer facing the first photosensitive pixel and a second oxide layer facing the second photosensitive pixel.

5. The image sensor of claim 1, each cavity further having a floor, and sidewalls spanning between the floor and the ceiling, wherein, for each cavity, one or both of the floor and the ceiling are at least partly jagged.

6. The image sensor of claim 5, jagged portions of the one or both of the floor and ceiling having pyramids extending into the semiconductor material enclosed by the cavity.

7. The image sensor of claim 1, being a backside-illuminated complementary metal oxide semiconductor image sensor, the semiconductor material being silicon.

8. The image sensor of claim 1, each microsphere being disposed directly on a respective one of the photosensitive pixels.

9. The image sensor of claim 1, the pixel array being a rectangular array, the photosensitive pixels having a pixel pitch along rows and columns of the pixel array, the diameter of each microsphere being equal to the pixel pitch.

10. The image sensor of claim 1, the ceiling including metal.

11. The image sensor of claim 1, each cavity further having a floor, and sidewalls spanning between the floor and the ceiling, wherein, for each cavity, the floor includes a respective metal contact for conducting a photo-generated charge out of the cavity.

12. The image sensor of claim 1, the semiconductor material being silicon, one of the spectral ranges including near-infrared wavelengths.

* * * * *